(12) United States Patent
Stanley

(10) Patent No.: US 6,927,626 B2
(45) Date of Patent: Aug. 9, 2005

(54) THERMAL PROTECTION SYSTEM FOR AN OUTPUT STAGE OF AN AMPLIFIER

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 330 days.

(21) Appl. No.: 10/252,328

(22) Filed: Sep. 23, 2002

(65) Prior Publication Data
US 2004/0060026 A1 Mar. 25, 2004

(51) Int. Cl.⁷ .......................... H03G 3/20; H03F 21/00
(52) U.S. Cl. .................. 330/128; 330/207 P; 330/298
(58) Field of Search ............................ 330/128, 207 P, 330/298; 361/98, 106

(56) References Cited

U.S. PATENT DOCUMENTS

| | | |
|---|---|---|
| 3,234,453 A | 2/1966 | Klees et al. |
| 3,493,879 A | 2/1970 | Stanley |
| 3,500,218 A | 3/1970 | Burwen |
| 3,526,846 A | 9/1970 | Campbell |
| 3,536,958 A | 10/1970 | Sondermeyer |
| 3,573,616 A | 4/1971 | Kahen |
| 3,808,545 A | 4/1974 | Stanley |
| 4,330,809 A | 5/1982 | Stanley |
| 4,611,180 A | 9/1986 | Stanley |
| 5,383,083 A * | 1/1995 | Shinoda et al. ............. 361/103 |
| 5,815,040 A | 9/1998 | Barbetta .................... 330/264 |
| 5,818,225 A | 10/1998 | Miekley et al. |
| 6,046,515 A * | 4/2000 | Lewis ........................ 307/95 |
| 6,051,933 A * | 4/2000 | Aiello et al. ............ 315/209 R |
| 6,144,256 A | 11/2000 | Barbetta .................... 330/255 |
| 6,204,657 B1 | 3/2001 | Stanley |
| 6,268,770 B1 | 7/2001 | Barbetta .................... 330/264 |
| 6,414,549 B1 | 7/2002 | Barbetta .................... 330/264 |
| 6,646,508 B1 | 11/2003 | Barbetta .................... 330/264 |
| 6,731,486 B2 * | 5/2004 | Holt et al. ................ 361/91.1 |

OTHER PUBLICATIONS

"MS5F4431 Intelligent Power MOSFET Specification", Oct. 22, 1998, Fuji Electric Co., Ltd., Matsumoto XP002274435, p. 5, Fig. "Block Diagram".

* cited by examiner

Primary Examiner—Khanh V. Nguyen
(74) Attorney, Agent, or Firm—Brinks Hofer Gilson & Lione

(57) ABSTRACT

Disclosed is a thermal protection circuit for an amplifier generating an amplified AC output signal. The thermal protection circuit may be powered by an amplifier power supply used to power the output stage. The amplifier power supply may be referenced to ground. The thermal protection circuit includes a power conditioner for providing regulated power rails to the other components of the thermal protection circuit. The regulated power rails may be referenced to the amplified AC output signal.

36 Claims, 4 Drawing Sheets

THERMAL PROTECTION SYSTEM FOR AN OUTPUT STAGE OF AN AMPLIFIER

BACKGROUND OF THE INVENTION

1. Technical Field

This invention relates generally to a thermal protection system for an output stage of an amplifier, and more particularly to the protection of the output devices of an output stage of an amplifier.

2. Related Art

Various circuit designs have been used to solve the problem of excessive localized heat production in output devices. Excessive heat leads to eventual breakdown and destruction of output devices. One popular circuit design is the V-I limiter. The V-I limiter circuit senses power dissipation in a output device by continually sensing the voltage and current of the output device, and limiting the output device driving signal when the product of the voltage and current exceeds a predetermined threshold. V-I limiter circuits are described in U.S. Pat. No. 3,234,453 issued to Klees, U.S. Pat. No. 3,500,218 issued to Burwen, U.S. Pat. No. 3,526,846 issued to Cambell, U.S. Pat. No. 3,536,958 issued to Sondermeyer, and U.S. Pat. No. 3,493,879 issued to Stanley.

The primary advantage of implementing a V-I limiter is simplicity. No additional power supplies are required to support the circuitry, and the circuit topology is relatively simple. The design of V-I limiters, however, typically sacrifices output power in order to protect the devices in "worst case" operating conditions that do not occur very often during normal operation. V-I limiters do not compensate for the actual temperature of the output devices being protected, but instead are usually designed with the assumption that the ambient temperature is high. Additionally, V-I limiters do not compensate for the actual power supply voltage, but instead are usually designed with the assumption of high power supply voltages. Such over-design results in increased costs due to extra output devices and mountings that are required.

Because of the limitations of V-I limiters, protection circuits were developed that simulate the actual temperature of an output device. These circuits are known as Junction Temperature Simulators (JTS). A JTS protection circuit is described in U.S. Pat. No. 4,330,809 issued to Stanley, and is incorporated by reference.

JTS circuits operate by monitoring the instantaneous power dissipated by an output device over time, and continuously calculating a differential in temperature between the output device and its heatsink. The instantaneous heatsink temperature is simultaneously measured, and the temperature differential and the heatsink temperature are summed to yield the simulated real-time output device temperature.

JTS protection circuits typically include an output limiter that monitors the simulated output device temperature during operation. When a threshold simulated temperature is reached, the driving signal to the output device is limited by the output limiter. JTS protection circuits maximize amplifier output by automatically reducing the output only when the prescribed maximum output device temperature is reached.

Traditionally, JTS has only been used in amplifiers rated at more than 200 watts because of constraints placed on the design of the circuits being protected and the associated costs. In traditional JTS circuit designs, the simulation circuitry is ground-referenced and powered by a regulated power supply having +/−15VDC rails. In amplifiers implementing the JTS circuitry, however, the power stages are typically implemented with swinging (non-ground referenced) rails. Therefore, a multi-channel amplifier implementing JTS requires a separate power supply for each channel, as well as an additional regulated power supply for the ground-referenced JTS circuit.

Because of the requirement for a separate regulated power supply, it is cost prohibitive to implement JTS in a simpler, lower-cost half-bridge amplifier where the power supply rails are ground-referenced and often shared with other output stages (channels). Therefore, lower-cost amplifiers that include thermal protection typically use V-I limiter protection circuitry. It would be desirable to implement JTS protection circuitry without incurring the cost of an additional traditional regulated power supply that requires additional secondary windings on a power transformer.

SUMMARY

This invention provides a JTS protection circuit that is not ground-referenced and, therefore, operates without a separate traditional regulated power supply. As such, the JTS protection circuit is practical and cost effective for low-cost high-power amplifiers. Manufacturing an amplifier containing a JTS protection circuit that is not ground-referenced is feasible in part due to the extensive use of automated test equipment during manufacturing. Automated test equipment typically functions "off ground" without exposing human operators to risk, and therefore allows safe and effective testing of such a JTS protection circuit.

The JTS protection circuit may operate in a half-bridge amplifier having an amplifier DC power supply for powering the output stage and the JTS protection circuit. The JTS protection circuit may include a power conditioner, a temperature simulator, an output limiter, and a bias control. The power conditioner may include a capacitor, a resistor, a Zener diode, and a commercially available voltage regulator. The power conditioner may be coupled to a positive (+Vcc) and a negative (−Vcc) power rail of the amplifier DC power supply, and also to an amplified AC output signal of the output stage. During operation, the power conditioner may provide regulated positive (+Vb) and negative (−Vb) power rails referenced to the amplified AC output signal of the output stage. The other components of the JTS protection circuit may also be referenced to the amplified AC output signal, and receive power from the regulated DC rails of the power conditioner.

Because the JTS protection circuitry is referenced to the amplified AC output signal of the output stage, the magnitude of a voltage indicative of the current through the output stage may be relatively small. The voltage indicative of current through the output stage may be utilized by the JTS protection circuitry to simulate temperatures within the output stage. Because the difference in the magnitude of voltage between the output stage devices and the amplified AC output signal are relatively small, the voltage indicative of current is also relatively small. In contrast, if the JTS protection circuitry were referenced to ground, the magnitude of voltage indicative of the current through the output stage would be much greater because it would include the voltage of the amplified AC output signal. Since the JTS protection circuitry is referenced to the amplified AC output signal, separation of the voltage indicative of the current from the much larger voltage of the amplified AC output signal is avoided.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale; emphasis is instead being placed upon illustrating the principles of the invention. Moreover, in the figures, like reference numerals designate corresponding parts throughout the different views.

DETAILED DESCRIPTION OF THE PREFERRED EMBODIMENTS

Figure 1:
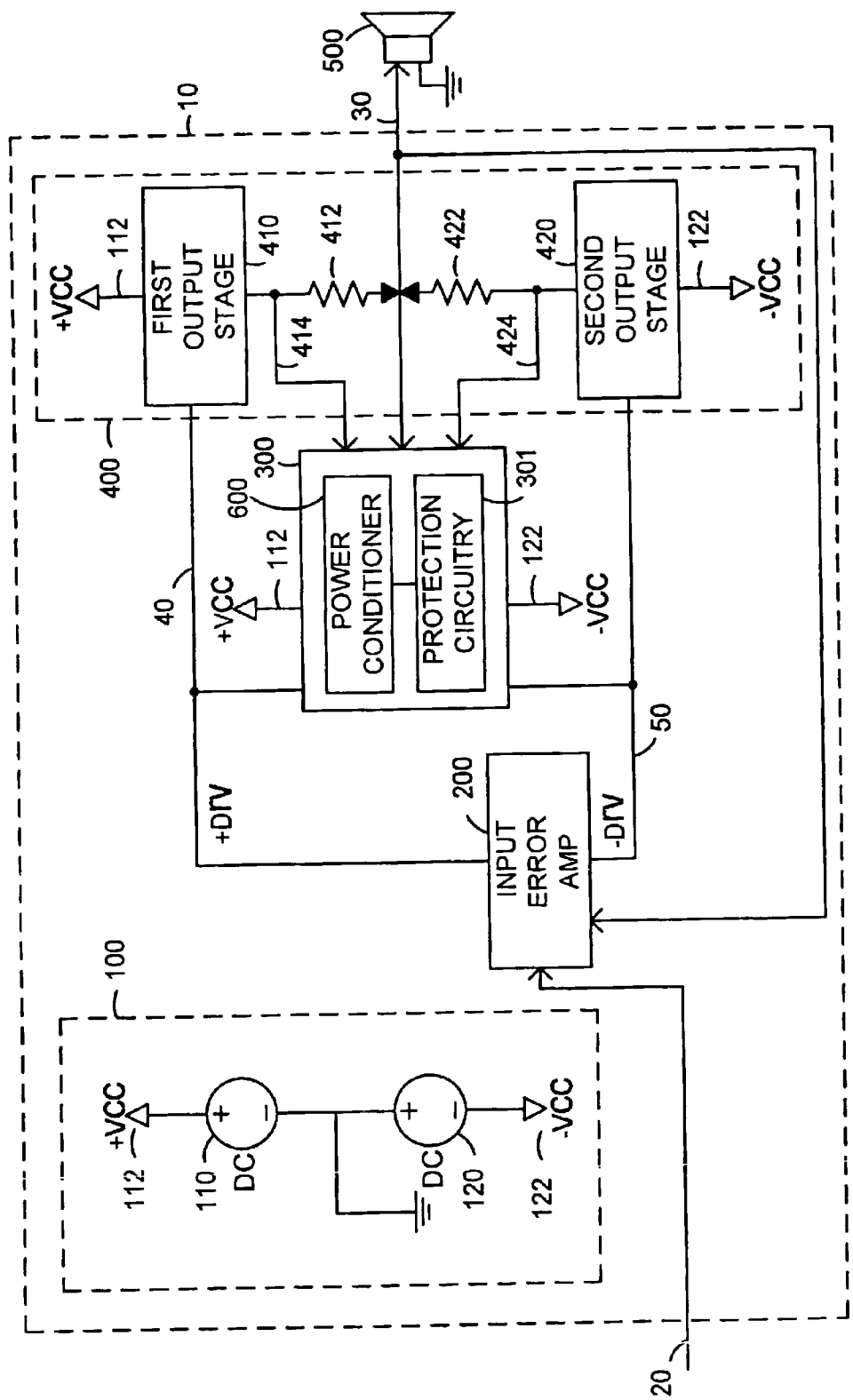
FIG. 1 is a system-level block diagram of a half-bridged amplifier utilizing a thermal protection circuit powered by an amplifier DC power supply.

FIG. 1 is a system level block diagram of half-bridged amplifier 10. Load 500 is shown in FIG. 1 coupled between half-bridged amplifier 10 and ground. Alternatively, a full-bridged amplifier may be constructed such that a first half-bridged amplifier 10 is coupled to a first input of load 500, and a second half-bridged amplifier 10 is coupled to a second input of load 500. Because each half-bridged amplifier 10 of such a full-bridged amplifier is similar, only one such half-bridged amplifier 10 is described herein.

Half-bridged amplifier 10 as shown in FIG. 1 receives an input signal on input signal line 20 and provides an amplified AC output signal on output signal line 30 to load 500. Load 500 is illustratively shown as a speaker; however, load 500 may be any electrical device requiring an amplified AC output signal. The input signal on input signal line 20 and the amplified AC output signal on output signal line 30 may each be referenced to ground.

Half-bridged amplifier 10 includes: amplifier DC power supply 100, input error amplifier 200, thermal protection circuit 300, and output stage 400. Amplifier DC power supply 100 may be any conventional DC power supply capable of producing DC power rails referenced to ground. The illustrated amplifier DC power supply 100 includes a first amplifier power supply 110 and a second amplifier power supply 120. First amplifier power supply 110 may provide +Vcc power rail 112 for output stage 400 of amplifier 10. Second amplifier power supply 120 may provide −Vcc power rail 122 for output stage 400 of amplifier 10. Both +Vcc power rail 112 and −Vcc power rail 122 may be referenced to ground.

Input error amplifier 200 may be any circuit or device for receiving an input signal and an output feedback signal, and generating therefrom a first and a second driving signal for driving output stage 400. The input signal to input error amplifier 200 may be the input signal on input signal line 20, and the output feedback signal may be the amplified AC output signal on output signal line 30. Input error amplifier 200 may determine the difference between the input signal on input signal line 20 and the amplified AC output signal on output signal line 30. This difference may be amplified, and converted by the input error amplifier 200 resulting in an amplified difference that is a first driving signal +Drv on signal line 40 and a second driving signal −Drv on signal line 50. First driving signal +Drv and second driving signal −Drv may drive output stage 400 to decrease the error between the input signal on input signal line 20 and the amplified AC output signal on output signal line 30.

Output stage 400 may operate as a Class A, Class B, Class AB, Class H, Class G, or any other type of linear or switching amplifier. Furthermore, output stage 400 may be constructed utilizing any conventional amplifier output topology, such as quasi-complimentary, full-complimentary, and the like. For each of these topologies, output stage 400 may include a variety of stages and output devices.

The illustrated output stage 400 includes: first output stage 410, second output stage 420, first current sensing resistor 412, and second current sensing resistor 422. First output stage 410 may provide a positive portion of the amplified AC output signal on output signal line 30. Second output stage 420 may provide a negative portion of the amplified AC output signal on output signal line 30.

First output stage 410 may include one or more power handling output devices, such as semiconductors mounted on one or more heatsinks. Second output stage 420 may similarly include one or more output devices. The power handling output devices may be any device capable of high frequency switching of high voltage and/or high current, such as some combination of bipolar junction transistors (NPN or PNP), metal oxide semiconductor field effect transistors (MOSFETs), or any other types of semiconductors.

Power signals representing instantaneous power dissipated by the first and second output stages 410 and 420 may be utilized by thermal protection circuit 300. The instantaneous power dissipated by one of the first and second output stages 410 or 420 may be determined by multiplying a value of voltage across one of the output stages 410 or 420 by a value of current through the respective output stage 410 or 420. The voltage across either of the output stages 410 or 420 may be determined by subtracting a value of voltage of the amplified AC output signal of the output stage 400 from the voltage of the power rail (+Vcc 112 or −Vcc 122, respectively) providing power to the respective output stage 410 or 420.

The instantaneous current may be determined by measuring the output current of the first and second output stages 410 and 420. One circuit for generating a current sensing signal that represents a value of current through one of the output stages 410 or 420 involves a current sensing resistor connected in series with the output of the respective output stages 410 or 420. Voltage drop across the resistor may provide the current sensing signal. As shown in FIG. 1, first current sensing resistor 412 may generate a first voltage signal on first current sensing signal line 414 that represents a value of a current through first output stage 410. Similarly, second current sensing resistor 422 may generate a second voltage signal for second output stage 420 on second current sensing signal line 424. Any mechanism for generating a value representing a current through the output stages 410 and 420, such as a giant magneto resistive (GMR) sensor, may be used to generate the current sensing signals on first and second current sensing signal lines 414 and 424.

The first and second voltage signals on first and second current sensing signal lines 414 and 424 are referenced to the amplified AC output signal on output signal line 30. Therefore, the magnitude of the first and second voltage signals may be relatively small, because the voltages between the outputs of first and second output stages 410 and 420 and the amplified AC output signal on output signal line 30 are relatively small.

If the first and second voltage signals were instead referenced to ground as in the prior art, the magnitudes of the first and second voltage signals would be much greater. This is because the first and second voltage signals would include the voltage of the amplified AC output signal on output signal line 30. In such an arrangement, highly precise components capable of "separating out" the small voltages dropped across resistors 412 and 422 from the high-magnitude first and second voltage signals may be utilized. These small voltages may be, for example, less than a volt each, while the amplified AC output signal may be over one hundred volts.

Thermal protection circuit 300 is therefore referenced to the amplified AC output signal on output signal line 30 to expedite "separating out" the small voltages across resistors 412 and 422. The illustrated thermal protection circuit 300 includes protection circuitry 301 and power conditioner 600. The power for thermal protection circuit 300 may be provided by amplifier DC power supply 100. More specifically, power conditioner 600 may receive power from +Vcc and −Vcc power rails 112 and 122, and provide regulated +Vb and −Vb power rails 630 and 640 to power protection circuitry 301. In addition, the protection circuitry 301 may receive power directly from +Vcc and −Vcc power rails 112 and 122. The inputs to thermal protection circuit 300 may also include the amplified AC output signal on output signal line 30, and first and second voltage signals on first and second current sensing signal lines 414 and 424.

During operation, thermal protection circuit 300 may simulate a temperature of one or more power handling output devices of first output stage 410 and/or second output stage 420. To protect the power handling output devices of output stage 400 from overheating, thermal protection circuit 300 may limit the first driving signal +Drv on signal line 40 and the second driving signal −Drv on signal line 50 when the simulated temperature rises above a threshold.

Figure 2:
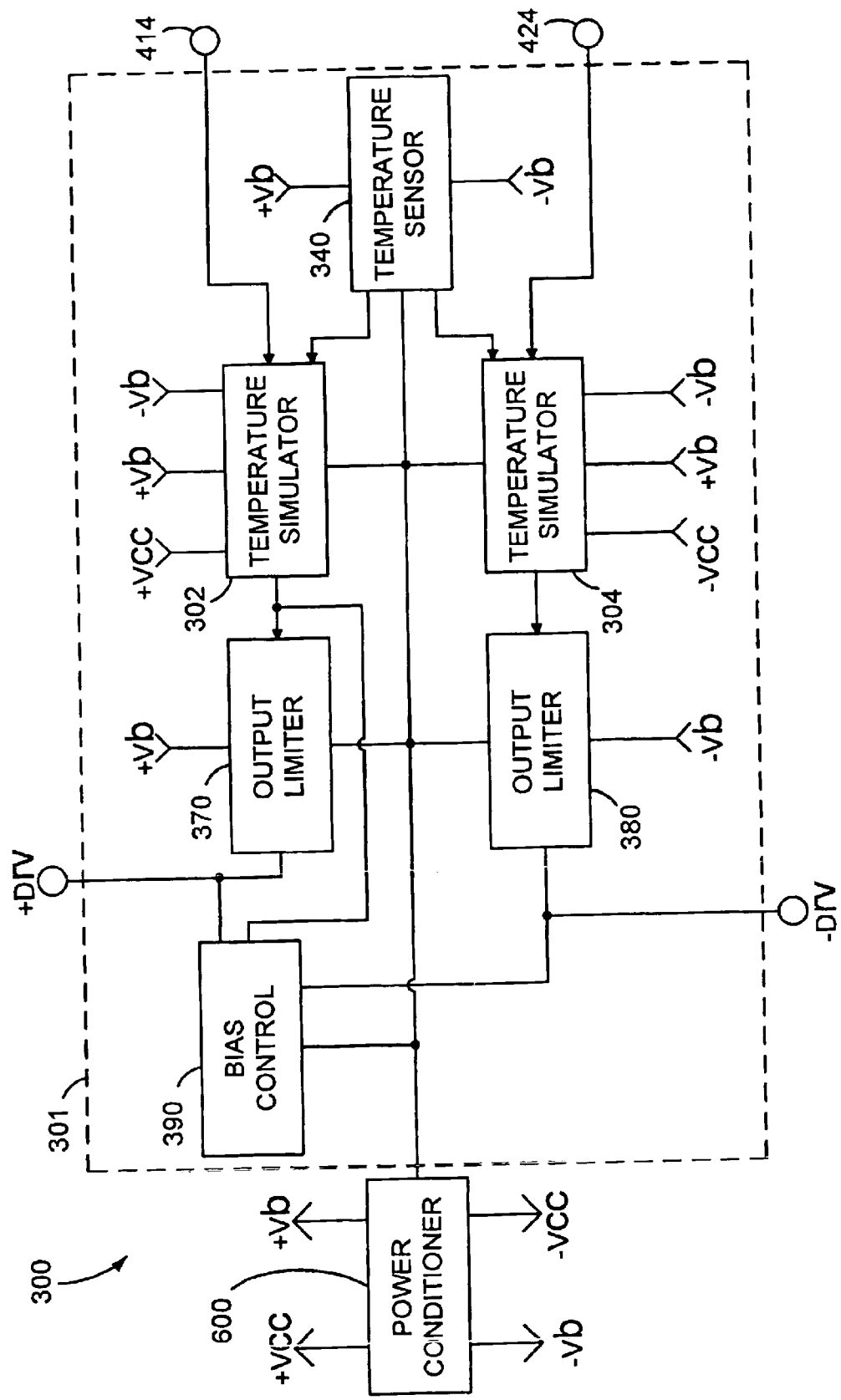
FIG. 2 is a block diagram of a thermal protection circuit for an amplifier.

FIG. 2 is a block diagram of thermal protection circuit 300 illustrated in FIG. 1. Thermal protection circuit 300 includes protection circuitry 301 and power conditioner 600. Protection circuitry 301 includes: temperature sensor 340, first temperature simulator 302, second temperature simulator 304, first output limiter 370, second output limiter 380, and bias control 390.

Temperature sensor 340 may be any circuit or device capable of sensing the actual temperature(s) of at least one heatsink in output stage 400 and providing a signal representative of the sensed temperature(s). First temperature simulator 302 and second temperature simulator 304 of thermal protection circuit 300 may each be any circuit or device capable of generating simulated temperatures of one or more power handling output devices.

First and second output limiters 370 and 380 may each be any circuit or device that, based upon a received temperature signal, may divert a portion of a driving current away from output stage 400 (FIG. 1). Bias control 390 may be any circuit or device for receiving a temperature signal and providing a biasing signal.

Figure 3:
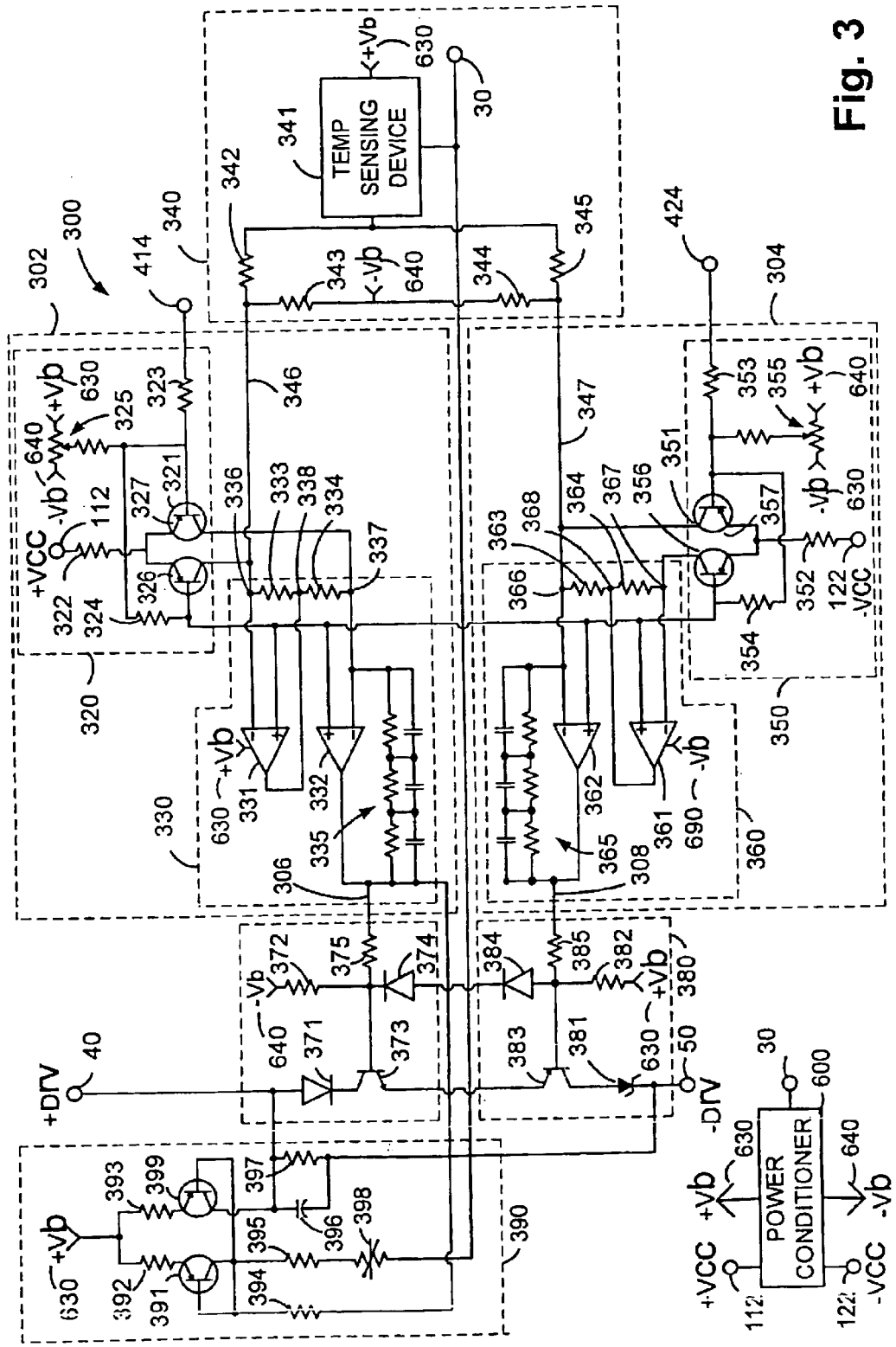
FIG. 3 is a schematic representation of a thermal protection circuit for an amplifier.

FIG. 3 is a circuit schematic of thermal protection circuit 300 illustrated in FIG. 1. Thermal protection circuit 300 includes protection circuitry 301 and power conditioner 600. Protection circuitry 301 includes: temperature sensor 340, first temperature simulator 302, second temperature simulator 304, first output limiter 370, second output limiter 380, and bias control 390.

The illustrated temperature sensor 340 includes: at least one temperature sensing device 341, first resistor 342, second resistor 343, third resistor 344, and forth resistor 345. Temperature sensor 340 shown in FIG. 3 includes a single temperature sensing device 341. However, temperature sensor 340 may include additional temperature sensing devices. More than one temperature sensing device 341 may be included where the expected power dissipation of first output stage 410 differs significantly from the expected power dissipation of second output stage 420. When only one temperature sensing device 341 is used, the heatsinking of output stage 400 may be configured in a manner to equalize the temperature of first and second output stages 410 and 420. Alternatively, temperature sensing device 341 may be positioned at the hottest portion of the heatsink(s).

Temperature sensing device 341 may be any circuit or device capable of providing a heatsink temperature signal that is a function of a sensed temperature. For example, temperature sensing device 341 may be a thermistor, a temperature sensitive transistor, a thermocouple, a temperature sensitive integrated circuit, or any other such device capable of providing a signal representative of sensed temperature. The illustrated temperature sensing device 341 may be a temperature sensitive integrated circuit, such as an LM35DT manufactured by National Semiconductor. In order to receive power, temperature sensing device 341 may be coupled between regulated +Vb power rail 630 (a positive output of power conditioner 600) and the amplified AC output signal on output signal line 30. Temperature sensing device 341 may generate a temperature output signal that changes as a function of the temperature of the heatsink to which it is mounted.

Resistors 342 and 345 may sum temperature dependent currents into first and second virtual ground summing nodes 346 and 347, respectively. First and second virtual ground summing nodes 346 and 347 may receive temperature output signals from temperature sensor 340. Fixed currents from resistors 343 and 344 may produce desired temperature signal offsets for temp simulators 302 and 304, respectively.

First temperature simulator 302 and second temperature simulator 304 may each generate simulated temperatures of one or more power handling output devices. For example, first temperature simulator 302 or second temperature simulator 304 may each be a digital computer or an analog computer. First and second temperature simulators 302 and 304 may receive one or more signals from which an instantaneous power dissipated by first or second output stage 410 or 420 may be calculated. In addition, the heatsink temperature signal from temperature sensor 340 may be received by the first and second temperature simulators 302 and 304. Based upon the received signals, first and second temperature simulators 302 and 304 may be means for generating simulated temperature signals representing a simulated temperature of one or more of the power handling output devices of first or second output stage 410 or 420, respectively.

First temperature simulator 302 shown in FIG. 3 includes first multiplier 320 and first simulation circuit 330. Second temperature simulator 304 may similarly include second multiplier 350 and second simulation circuit 360. First and second multipliers 320 and 350 may multiply a first input voltage by a second input voltage, and provide an output current representing the product.

First multiplier 320 may be any circuit or device capable of generating a power signal representing an instantaneous power dissipated by first output stage 410 based on voltage across first stage 410, and a current through first output stage 410. As previously discussed, the voltage across first stage 410 may be the voltage difference between the voltage of the amplified AC output signal on output signal line 30 and a voltage of +Vcc power rail 112. The current sensing signal indicating an instantaneous current through first output stage 410 may be the first voltage signal on first current sensing signal line 414.

Similarly, second multiplier 330 may be any circuit or device capable of generating a power signal representing an instantaneous power dissipated by second output stage 420 based on an instantaneous voltage signal and a current sensing signal. Second multiplier 350 may operate in a like fashion to first multiplier 320.

As shown in FIG. 3, first multiplier 320 may be a two quadrant transconductance multiplier. First multiplier 320 includes: matched pair of bipolar junction transistors 321, first resistor 322, second resistor 323, third resistor 324 and potentiometer 325. Matched pair of bipolar junction transistors 321 includes first transistor 327 and second transistor 326. First multiplier 320 may operate with voltages at or above the amplified AC output signal on output signal line 30. Accordingly, first and second transistors 327 and 326 may be PNP transistors.

First resistor 322 may be coupled between +Vcc power rail 112 and the common connected emitters of first and second transistors 327 and 326. First resistor 322 may provide a current to first and second transistors 327 and 326 that is proportional to the voltage applied to first power stage 410. During operation, second resistor 323 may be coupled between first current sensing signal line 414 and the base of first transistor 327. Second resistor 323 may create a current to drive first transistor 327 proportional to a voltage of the first current sensing signal on first current sensing signal line 414.

Third resistor 324 may be coupled between the base of first transistor 327 and output signal line 30. Resistors 323 and 324 may bias matched pair 321. The base of second transistor 326 may be coupled to output signal line 30. This references multiplier 320 to the amplified AC output signal on output signal line 30. In other words, multiplier 320 "floats" with the amplified AC output signal on output signal line 30. The output generated by first multiplier 320 may be a sum of collector currents of first and second transistors 327 and 326. The output generated by first multiplier 320 may be a first power signal referenced to the amplified AC output signal on output signal line 30. This first power signal may represent an instantaneous power dissipated by first output stage 410.

Second multiplier 350 may also be a two quadrant transconductance multiplier. Second multiplier 350 includes: matched pair of bipolar junction transistors 351, first resistor 352, second resistor 353, third resistor 354 and potentiometer 355. Matched pair of bipolar junction transistors 351 includes first transistor 357 and second transistor 356. Second multiplier 350 may operate with voltages at or below the amplified AC output signal on output signal line 30. Accordingly, first and second transistors 357 and 356 may be NPN transistors.

Second multiplier 350 may operate in the same manner as first multiplier 320. However, second multiplier 350 may be coupled to −Vcc power rail 122 and second current sensing signal line 424. Accordingly, the output generated by second multiplier 350 may be a second power signal representing an instantaneous power dissipated by second output stage 420.

Matched pairs 321 and 351 may operate in conjunction with one another, and may not be perfectly matched to each other. For balanced operation, standard potentiometers 325 and 355 may be included in first and second multipliers 320 and 350, respectively, to trim the base-to-base offset voltage between first transistor 327 and second transistor 326 of matched pair 321 and first transistor 357 and second transistor 356 of matched pair 351.

First simulation circuit 330 may generate a first simulated temperature signal that is a function of the first power signal generated by multiplier 320, and the first temperature signal generated by temperature sensor 340. Similarly, second simulation circuit 360 may generate a second simulated temperature signal that is a function of the second power signal generated by multiplier 350, and the second temperature signal generated by temperature sensor 340.

First and second simulation circuits 330 and 360 may be any circuit or device capable of modeling the thermal impedance of one or more of the power handling output devices of output stage 400. First simulation circuit 330 includes: first operational amplifier 331, second operational amplifier 332, first resistor 333, second resistor 334, and feedback network 335. First operational amplifier 331 may be a high-gain operational amplifier. The non-inverting inputs of first and second operational amplifiers 331 and 332 may be coupled to output signal line 30. As such, all inputs and outputs of first simulation circuit 330 may be referenced to the amplified AC output signal on output signal line 30. In other words, first simulation circuit 330 "floats" with the amplified AC output signal on output signal line 30.

First and second resistors 333 and 334 may be matched and form a resistor network having first terminus 336, a second terminus 337, and a common node 338. First terminus 336 may be coupled to the collector of second transistor 326 of multiplier 320, to first virtual ground summing node 346, and to the inverting input of first operational amplifier 331. Second terminus 337 may be coupled to the collector of first transistor 327 of multiplier 320, and to the inverting input of second operational amplifier 332. Common node 338 may be coupled to the output of first operational amplifier 331. First operational amplifier 331 and the resistor network may operate as a current mirror to generate a combined output current.

Feedback network 335 may include resistor-capacitor (RC) networks, resistor-inductor (RL) networks, and/or resistor-inductor-capacitor (RLC) networks to model the thermal impedance of one or more of the power handling output devices of first output stage 410. Feedback network 335 is illustrated as a third order resistor-capacitor (RC) network. Feedback network 335 may be of any order, however, a more accurate simulation may be achieved utilizing a higher order network.

Feedback network 335 may be coupled between the output and the inverting input of second operational amplifier 332. Second operational amplifier 332 and feedback network 335 may convert the combined output current from the current mirror into a first temperature signal on first temperature signal line 306. The first temperature signal may represent the temperature of one or more of the power handling output devices of first output stage 410.

Similar to first simulation circuit 330, second simulation circuit 360 includes: first operational amplifier 361, second operational amplifier 362, first resistor 363, second resistor 364, and feedback network 365. Like first simulation circuit 330, second simulation circuit 360 "floats" with the amplified AC output signal on output signal line 30.

Second simulation circuit 360 may operate in the same manner as first simulation circuit 330, except second simulation circuit 360 may be coupled to second multiplier 350 rather than to first multiplier 320. In addition, second simulation circuit 360 may be coupled to second virtual ground summing node 347, rather than to first virtual ground summing node 346. Accordingly, the output generated by second simulation circuit 360 may be a second temperature signal on second temperature signal line 308 representing the temperature of one or more of the power handling output devices of second output stage 420, rather than of first output stage 410.

First and second output limiters 370 and 380 may each divert a portion of a driving current away from output stage 400, based upon a received temperature signal. For example, diverting components of first and second output limiters 370 and 380 may be mechanically driven potentiometers or rheostats, bipolar junction transistors, MOSFETs, or triacs. Accordingly, the first and second output limiters 370 and 380 may be means for limiting power dissipated by power handling output device(s) in the output stage 400.

As illustrated in FIG. 3, first output limiter 370 includes: first diode 371, first resistor 372, transistor 373, second diode 374, and second resistor 375. The anode of first diode 371 may be coupled to signal line 40. The cathode of first diode 371 may be coupled to the collector of transistor 373. The emitter of transistor 373 may be coupled to output signal line 30. The base of transistor 373 may be coupled to the cathode of diode 374, to first resistor 372, and to second resistor 375. The anode of second diode 374 may be coupled to output signal line 30. First resistor 372 may also be coupled to regulated −Vb power rail 640, the negative output of power conditioner 600. Second resistor 375 may be coupled to first temperature signal line 306 extending from temperature simulator 302.

First and second resistors 372 and 375 and second diode 374 may act as a voltage offset and attenuation network to increase the voltage dynamics of the first temperature signal on first temperature signal line 306. This may allow tailoring of the maximum voltage of the first temperature signal from temperature simulator 302 to increase the represented thermal range. First diode 371 may prevent current from flowing through transistor 373 in a reverse direction. When the first temperature signal from temperature simulator 302 increases above a threshold temperature, transistor 373 may be enabled. The threshold temperature may be a temperature above which the power handling output device being modeled experiences thermal breakdown. When transistor 373 is enabled, a portion of the current of the first driving signal +Drv on signal line 40 may be diverted away from first output stage 410. This diversion may limit the power dissipated by first output stage 410.

Similar to first output limiter 370, second output limiter 380 includes: first diode 381, first resistor 382, transistor 383, second diode 384, and second resistor 385. Second output limiter 370 may operate in a manner similar to first output limiter 370. One input to second output limiter 380 may be the second temperature signal on second temperature signal line 308 from second temperature simulator 304. During operation, second output limiter 380 may divert a portion of the current of the second driving signal −Drv on signal line 50 away from second output stage 420.

During operation, as the power handling output devices of output stage 400 dissipate power, they may become warmer and, therefore, more conductive. As they become more conductive, the power handling output devices of output stage 400 may require smaller driving signals +Drv and −Drv on signal lines 40 and 50 to maintain a quiescent current flow during quiescent conditions. Quiescent conditions may occur when there is no input signal on the input signal line 20 while the half-bridge amplifier is operating.

If the driving signals +Drv and −Drv on signal lines 40 and 50 are held constant when there is no signal on input signal line 20, then the quiescent current through output stage 400 may increase. As the quiescent current through output stage 400 increases, the power handling output devices of output stage 400 may dissipate more power and continue becoming warmer. In this manner, the quiescent current through output stage 400, and the temperature of power handling output devices, may continue increasing when there is no signal or a relatively small signal on input signal line 20.

Bias control 390 may bias the output stage 400 (FIG. 1) with a biasing signal. The biasing signal may be based on the first temperature signal provided by first temperature simulator 302. During operation, the biasing signal may bias the first and second driving signals +Drv and −Drv on signal lines 40 and 50. This biasing may dynamically adjust the driving signals +Drv and −Drv on signal lines 40 and 50 so as to maintain a substantially constant quiescent current through output stage 400. A substantially constant quiescent current minimizes noise in the amplified AC output signal and heat in the output stage 400.

As illustrated in FIG. 3, bias control 390 is a means for biasing the output stage 400 that includes: first transistor 391, second transistor 399, first resistor 392, second resistor 393, third resistor 394, fourth resistor 395, capacitor 396, fifth resistor 397, and rheostat 398. First and second transistors 391 and 399 may be a matched pair of transistors, such as bipolar junction transistors.

First resistor 392 may be coupled between regulated +Vb power rail 630 and the emitter of first transistor 391. Second resistor 393 may be coupled between regulated +Vb power rail 630 and the emitter of second transistor 399. The base of first transistor 391 may be coupled to the collector of first transistor 391, the base of second transistor 399, third resistor 394, and fourth resistor 395. Third resistor 394 may also be coupled to first temperature signal line 306 from first temperature simulator 302. Fourth resistor 395 may also be coupled to rheostat 398. Rheostat 398 may also be coupled to output signal line 30. The collector of second transistor 399 may be coupled to signal line 40, which carries the first driving signal +Drv. Capacitor 396 and fifth resistor 397 may be coupled between signal line 40 and signal line 50.

First and second transistors 391 and 399, and first and second resistors 392 and 393 may operate as a current mirror. The current mirror may have a gain that is equal to the value of first resistor 392 divided by the value of second resistor 393. The input to the current mirror may be derived from an adjustable but fixed resistor network including third and fourth resistors 394 and 395, and rheostat 398. The first temperature signal on first temperature signal line 306 from first temperature simulator 302 may be applied to the resistor network through fourth resistor 394. The output of the current mirror may provide biasing voltage for the first and second driving signals +Drv and −Drv on signal lines 40 and 50, respectively.

Rheostat 398 may allow for manual adjustment of the bias of output stage 400 to minimize quiescent current through output stage 400. For example, rheostat 398 may be used to initially adjust the bias of output stage 400 when the amplifier is first assembled, or when output devices in output stage 400 are replaced. Fifth resistor 397 and capacitor 396 may operate as a low pass filter preventing AC cross-talk between the first and second driving signals +Drv and −Drv.

As illustrated in FIG. 3, power conditioner 600 may be a means for conditioning DC power. For example, power conditioner 600 may be any circuit or device for receiving power from +Vcc and −Vcc power rails 112 and 122, and providing regulated +Vb and −Vb power rails 630 and 640 referenced to the amplified AC output signal on output signal line 30. As previously discussed, components of thermal protection circuit 300, including first and second temperature simulators 302 and 304, first and second output limiters 370 and 380, temperature sensor 340 and bias control 390 may be referenced to the amplified AC output signal, and receive power from the regulated +Vb and −Vb power rails 630 and 640.

Figure 4:
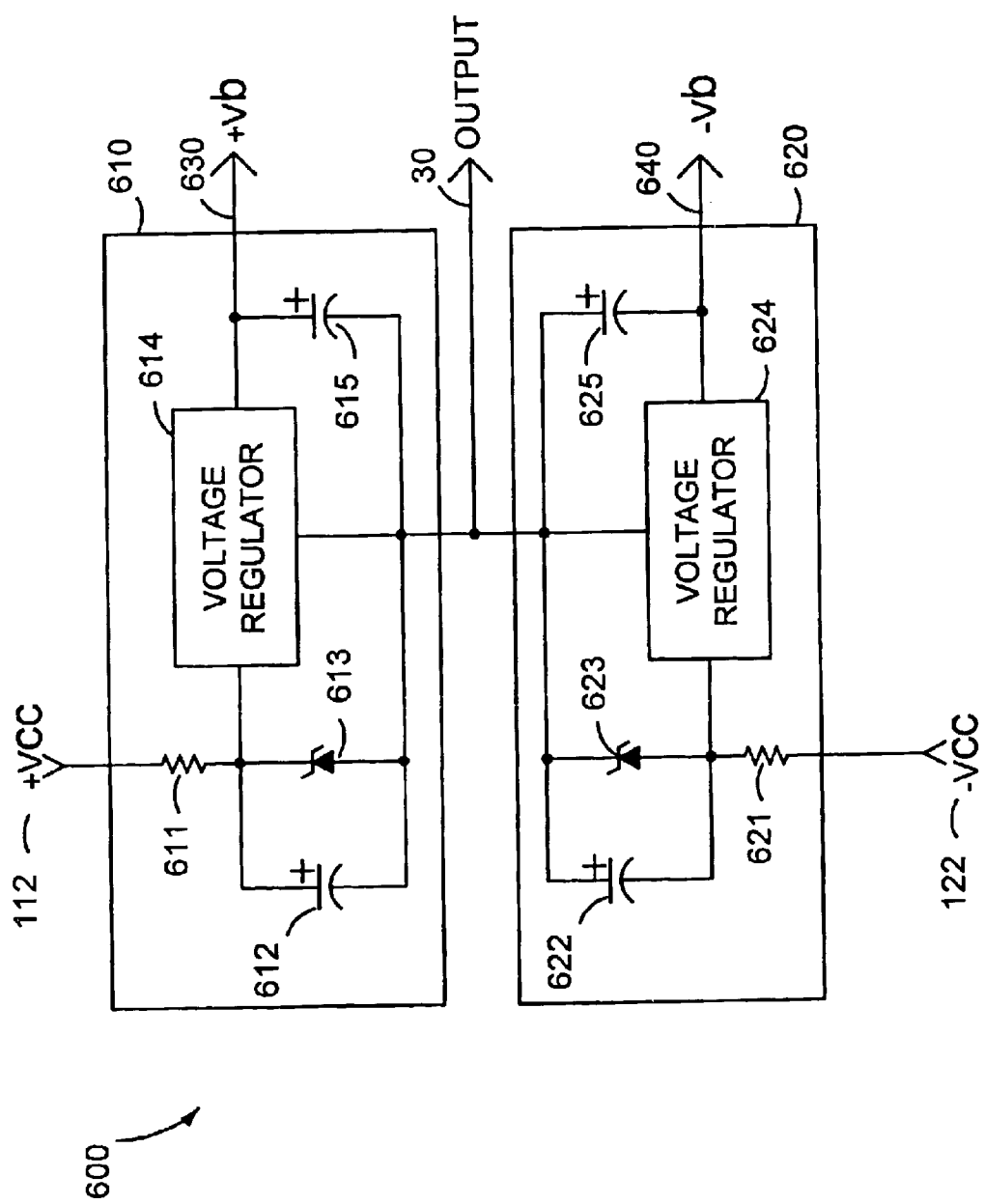
FIG. 4 is a schematic representation of power conditioner for thermal protection circuit.

FIG. 4 is a schematic representation of power conditioner 600. Power conditioner 600 may include first power conditioner 610 and second power conditioner 620. First power conditioner 610 may receive +Vcc power rail 112 from first amplifier power supply 110 and produce regulated +Vb power rail 630. Regulated +Vb power rail 630 may be referenced to the amplified AC output signal on output signal line 30. Second power conditioner 620 may similarly receive −Vcc power rail 122 from second amplifier power supply 120 and produce regulated −Vb power rail 640. Regulated −Vb power rail 640 may similarly be referenced to the amplified AC output signal on output signal line 30.

First power conditioner 610 includes: resistor 611, first capacitor 612, diode 613, voltage regulator 614, and second capacitor 615. Voltage regulator 614 may be an integrated circuit voltage regulator such as a 78L15, manufactured by National Semiconductor. Diode 613 may be a Zener diode having a Zener breakdown voltage greater than the minimum but less than the maximum rated input voltage for voltage regulator 614.

Resistor 611 may be coupled between +Vcc power rail 112 and the input of voltage regulator 614. Diode 613 may be coupled between output signal line 30 and the input of voltage regulator 614. First capacitor 612 may be coupled between output signal line 30 and the input of voltage regulator 614. Second capacitor 615 may be coupled between output signal line 30 and the output of voltage regulator 614.

An explanation of the operation of first power conditioner 610 may be understood using an example with illustrative voltage values. The voltage values are merely illustrative, and other values may be used. During operation, first power conditioner 610 may receive power from +Vcc power rail 112. Voltage regulator 614 may operate with a minimum input voltage, such as 18 volts, in order to maintain a regulated output voltage, such as 15 volts. Diode 613 may have a Zener breakdown voltage such as 24 volts. Zener diode 613 may provide the Zener breakdown voltage of 24 volts across capacitor 612 and at the input of voltage regulator 614. This will occur so long as the voltage difference between +Vcc power rail 112 and the amplified AC output signal on output signal line 30 is greater than about 25 volts.

Because there may be a potential of 24 volts across first capacitor 612, first capacitor 612 may charge to a potential of 24 volts. Therefore, whenever the voltage difference between +Vcc power rail 112 and the amplified AC output signal on output signal line 30 falls below 24 volts, first capacitor 612 may discharge current into voltage regulator 614. While this condition exists, first capacitor 612 may also discharge current into amplifier power supply 110. Resistor 611 may be included in order to limit this current flow, and may be capable of handling some power dissipation, for example two or three watts.

First capacitor 612 may be sized to maintain the minimum input voltage for voltage regulator 614 to sustain regulated operation for a determined period of time. The determined period of time may be based on the highest output level and the longest interval of the amplified AC output signal on output signal line 30. Diode 613 may be included if the potential voltage difference between +Vcc power rail 112 and the amplified AC output signal on output signal line 30 may be high enough to damage voltage regulator 614.

During operation, the input of voltage regulator 614 may be provided with the minimum voltage for regulated operation by either +Vcc power rail 112 or by first capacitor 612. Voltage regulator 614 may provide regulated +Vb power rail 630 to other components of thermal protection circuit 300 as previously discussed. Capacitor 615 may be included to maintain the voltage of regulated +Vb power rail 630 during short periods of heavy loading.

Second power conditioner 620 similarly includes: resistor 621, first capacitor 622, diode 623, voltage regulator 624, and second capacitor 625. Voltage regulator 624 may be an integrated circuit voltage regulator such as a 79L15, manufactured by National Semiconductor. Diode 623 may be a Zener diode having a Zener breakdown voltage greater than the minimum but less than the maximum rated input voltage for voltage regulator 624.

Similar to first power conditioner 610, second power conditioner 620 may be operable to receive power from −Vcc 122 power rail and produce regulated −Vb power rail 640 referenced to the amplified. AC output signal on output signal line 30. Regulated −Vb power rail 640 may be provided to other components of thermal circuit 300 as previously discussed.

Referring again to FIGS. 1–4, the thermal protection circuit 300 may operate in a half-bridged amplifier 10 having an amplifier DC power supply 100 for powering the output stage 400. The thermal protection circuit 300 may receive power from the amplifier power supply 100. The power conditioner 600 within the thermal protection circuit 300 may provide regulated power to the first and second temperature simulators 302 and 304, the first and second output limiters 370 and 380, and the bias control 390. The power conditioner 600 may allow the thermal protection circuit 300 to operate referenced to the amplified AC output signal. By operating referenced to the amplified AC output signal, the thermal protection circuit 300 may operate with smaller voltages and currents than if it were referenced to ground.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A thermal protection circuit for an output stage of an amplifier, where the output stage receives DC power from an amplifier power rail referenced to ground and generates an amplified AC output signal comprising:

a power conditioner where the power conditioner is operable to provide a regulated power rail referenced to the amplified AC output signal from the amplifier power rail referenced to ground; and protection circuitry coupled to the power conditioner and where the protection circuitry is referenced to the amplified AC output signal and is energized by the regulated power rail to thermally protect the output stage.

2. The thermal protection circuit of claim 1 where the power conditioner comprises a first capacitor, a resistor, and a voltage regulator having an input and an output, where the input of the voltage regulator, the first capacitor, and the resistor are each coupled between the amplifier power rail and the amplified AC output signal, and the output of the voltage regulator is coupled between the regulated power rail and the amplified AC output signal.

3. The thermal protection circuit of claim 2 where the power conditioner comprises a Zener diode coupled between the amplifier power rail and the amplified AC output signal.

4. The thermal protection circuit of claim 2 where the power conditioner further comprises a second capacitor, the second capacitor coupled between the regulated power rail and the amplified AC output signal.

5. The thermal protection circuit of claim 1 where the amplifier power rail comprises a positive amplifier power rail and a negative amplifier power rail, and the power conditioner comprises a first power conditioner and a second power conditioner.

6. The thermal protection circuit of claim 5 where the first power conditioner is operable to generate a regulated positive power rail referenced to the amplified AC output signal, the regulated positive power rail generated from the positive amplifier power rail referenced to ground.

7. The thermal protection circuit of claim 5 where the second power conditioner is operable to generate a regulated negative power rail referenced to the amplified AC output signal, the regulated negative power rail generated from the negative amplifier power rail referenced to ground.

8. The thermal protection circuit of claim 1 where the protection circuitry includes a temperature simulator and the output stage includes an output device, the temperature simulator operable to provide a simulated temperature signal, the simulated temperature signal indicative of a simulated temperature of the output device.

9. The thermal protection circuit of claim 8 where the protection circuitry further includes an output limiter, the output limiter operable to reduce power dissipated by the output device as a function of the simulated temperature signal when the simulated temperature of the output device is above a threshold temperature.

10. The thermal protection circuit of claim 8 where the protection circuitry further includes a bias control, the bias control operable to generate a bias signal for the output stage as a function of the simulated temperature signal, the bias signal operable to dynamically adjust the bias of the output stage to maintain a substantially constant quiescent current through the output stage during quiescent conditions.

11. The thermal protection circuit of claim 1 where the protection circuitry includes a bias control, where the bias control is operable to adjust the bias of the output stage to maintain a substantially constant quiescent current through the output stage.

12. The thermal protection circuit of claim 11 where the bias control is operable to adjust the bias as a function of a simulated temperature of the output stage.

13. A thermal protection circuit for an output stage of an amplifier, where the output stage receives DC power from an amplifier DC power rail and generates an amplified AC output signal comprising:

a means for conditioning DC power, the means for conditioning operable to generate a regulated power rail referenced to the amplified AC output signal from the amplifier power rail referenced to ground; and means for thermally protecting the output stage, the means for thermally protecting coupled to the means for conditioning, where the means for thermally protecting is referenced to the amplified AC output signal and energized by the regulated power rail.

14. The thermal protection circuit of claim 13 where the amplifier DC power rail comprises a positive DC amplifier power rail and a negative DC amplifier power rail, and the means for conditioning includes a first means for conditioning and a second means for conditioning, the first means for conditioning operable to generate a positive regulated power rail referenced to the amplified AC output signal from the positive DC amplifier power rail, the second means for conditioning operable to generate a negative regulated power rail referenced to the amplified AC output signal from the negative DC amplifier power rail.

15. The thermal protection circuit of claim 13 where the means for conditioning is a power conditioner comprising a capacitor, a resistor, and a voltage regulator.

16. The thermal protection circuit of claim 15 where the power conditioner comprises a Zener diode.

17. The thermal protection circuit of claim 13 where the means for thermally protecting includes means for generating a simulated temperature signal and the output stage includes an output device, where the simulated temperature signal is indicative of temperature of the output device.

18. The thermal protection circuit of claim 17 where the means for thermally protecting further includes means for limiting power dissipated by the output device, the means for limiting operable to reduce power dissipated by the output device as a function of the simulated temperature signal.

19. The thermal protection circuit of claim 17 where the means for thermally protecting further includes a means for biasing the output stage, the means for biasing operable to generate a bias signal for the output stage as a function of the simulated temperature signal, the bias signal operable to adjust the bias of the output stage to maintain a substantially constant quiescent current through the output stage.

20. The thermal protection circuit of claim 13 where the means for thermally protecting includes a means for biasing the output stage, the means for biasing operable to adjust the bias of the output stage to maintain a substantially constant quiescent current through the output stage.

21. The thermal protection circuit of claim 20 where the means for biasing is operable to adjust the bias as a function of a simulated temperature of the output stage.

22. An amplifier comprising:

an amplifier DC power supply operable to generate an amplifier power rail referenced to ground;

an output stage referenced to ground operable to receive the amplifier power rail and generate an amplified AC output signal;

a power conditioner, the power conditioner operable to provide a regulated power rail referenced to the amplified AC output signal from the amplifier power rail; and protection circuitry coupled to the power conditioner, the protection circuitry referenced to the amplified AC output signal and energized by the regulated power rail to thermally protect the output stage.

23. The amplifier of claim 22 where the output stage is configured as a half-bridged amplifier.

24. The amplifier of claim 22 where the output stage is configured as a full-bridged amplifier.

25. The amplifier of claim 22 where the power conditioner comprises a first capacitor, a resistor, and a voltage regulator having an input and an output, where the input of the voltage regulator, the first capacitor, and the resistor are each coupled between the amplifier power rail and the amplified AC output signal, and the output of the voltage regulator is coupled between the regulated power rail and the amplified AC output signal.

26. The thermal protection circuit of claim 25 where the power conditioner comprises a Zener diode coupled between the amplifier power rail and the amplified AC output signal.

27. The amplifier of claim 25 where the power conditioner further comprises a second capacitor, the second capacitor coupled between the regulated power rail and the amplified AC output signal.

28. The amplifier of claim 22 where the protection circuitry includes a temperature simulator and the output stage includes an output device, the temperature simulator operable to provide a simulated temperature signal, the simulated temperature signal indicative of a simulated temperature of the output device.

29. The amplifier of claim 28 where the protection circuitry further includes an output limiter, the output limiter operable to reduce power dissipated by the output device as a function of the simulated temperature signal.

30. The amplifier of claim 22 where the protection circuitry further includes a bias control, the bias control operable to bias the output stage to maintain a substantially constant quiescent current through the output stage during quiescent conditions.

31. An amplifier comprising:
a DC power supply operable to generate an amplifier power rail referenced to ground;
an output stage referenced to ground operable to receive the amplifier power rail and generate an amplified AC output signal;
a power conditioner, the power conditioner operable to generate a regulated power rail referenced to the amplified AC output signal from the amplifier power rail; and
a bias control, the bias control referenced to the amplified AC output signal and energized by the regulated power rail;
where the bias control is operable to bias the output stage.

32. The amplifier of claim 31 where the bias control is operable to maintain a substantially constant quiescent current through the output stage during quiescent conditions.

33. The amplifier of claim 31 where the bias control is operable to bias the output stage as a function of temperature of the output stage.

34. A method for thermally protecting an output stage of an amplifier, where the output stage receives DC power and generates an amplified AC output signal, the method comprising:
providing DC power to an output device of the output stage, the DC power referenced to ground;
driving the output device with an input signal so that the output device produces an amplified AC output signal from the DC power;
conditioning the DC power to provide regulated DC power referenced to the amplified AC output signal;
energizing thermal protection circuitry with the regulated DC power referenced to the amplified AC output signal;
generating a simulated temperature signal with the thermal protection circuitry, the simulated temperature signal indicative of a simulated temperature of the output device; and
reducing the input signal to the output device with the thermal protection circuit when the simulated temperature of the output device is above a threshold temperature.

35. The method of claim 34 where generating a simulated temperature signal comprises:
receiving a current sensing signal with the thermal protection circuitry, the current sensing signal indicative of a current though the output stage;
receiving a voltage signal with the thermal protection circuit, the voltage signal indicative of a voltage across the output stage; and
receiving a temperature signal with the thermal protection circuitry, the temperature signal indicative of a temperature of the output stage,
where the simulated temperature signal is generated based on the current signal, the voltage signal, and temperature signal.

36. The method of claim 34 further comprising biasing the output stage with the protection circuitry to maintain a substantially constant quiescent current through the output stage during quiescent conditions.

* * * * *